United States Patent
Eberler et al.

(10) Patent No.: US 7,421,747 B2
(45) Date of Patent: Sep. 9, 2008

(54) METHOD OF INSTALLING AND REMOVING A COMPONENT OF MEDICAL DEVICE

(75) Inventors: Ludwig Eberler, Postbauer-Heng (DE); Michael Eberler, Postbauer Heng (DE); Wolfgang Renz, Erlangen (DE); Guenther Zebelein, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 659 days.

(21) Appl. No.: 10/726,251

(22) Filed: Dec. 2, 2003

(65) Prior Publication Data

US 2004/0158922 A1  Aug. 19, 2004

(30) Foreign Application Priority Data

Dec. 2, 2002  (DE)  ................... 102 56 211

(51) Int. Cl.
*A61B 6/04* (2006.01)
(52) U.S. Cl. ............ 5/81.1 R; 5/601; 378/209; 600/415
(58) Field of Classification Search ......... 5/601, 5/81.1 R, 943; 378/209; 600/415
See application file for complete search history.

(56) References Cited

U.S. PATENT DOCUMENTS

| | | | |
|---|---|---|---|
| 4,567,894 A | 2/1986 | Bergman | |
| 4,727,328 A * | 2/1988 | Carper et al. | 324/318 |
| 5,066,915 A | 11/1991 | Omori et al. | |
| 5,197,474 A * | 3/1993 | Englund et al. | 600/415 |
| 6,526,609 B2 * | 3/2003 | Wong | 5/601 |
| 2002/0104163 A1* | 8/2002 | Reimann | 5/601 |
| 2002/0129446 A1* | 9/2002 | Heinold et al. | 5/601 |
| 2003/0009825 A1* | 1/2003 | Gallant et al. | 5/81.1 R |

FOREIGN PATENT DOCUMENTS

EP  0 5652 542  7/1993

OTHER PUBLICATIONS www.mritutor.org/mritutor/gradcoil.htm, Copyright 1994-1996.*

* cited by examiner

*Primary Examiner*—T L Mayo
(74) *Attorney, Agent, or Firm*—Schiff Hardin LLP

(57) ABSTRACT

A device to install and remove a structural component in and from a medical large device has a guide system that simplifies the difficult handling of the structural component due to the size or the weight of the structural component. The guide system has a first guide rail that can be positioned on a height-adjustable patient bed of the large device, and a guide groove which is arranged on the structural component. Additionally, another second guide rail can be attached to the medical large device, which forms an extension of the first guide rail when the patient bed is correspondingly positioned. With this device the structural component can be easily raised and lowered with the aid of the height-adjustable patient bed, and can easily be slid into and out of the large device when the first and second rails are at the same height.

1 Claim, 2 Drawing Sheets

METHOD OF INSTALLING AND REMOVING A COMPONENT OF MEDICAL DEVICE

BACKGROUND OF THE INVENTION

1. Field of the Invention

The present invention concerns a device to install and remove a structural component, as well as a method to install or remove a structural component of a large medical device. The invention also concerns a magnetic resonance tomography device with a device to install and remove a structural component, as well as a magnetic resonance tomography device with a gradient system and a high-frequency body antenna to implement an installation and removal method.

2. Description of the Prior Art

The installation and removal of large, unwieldy structural components in and from medical large devices is typically implemented with a number of people. Under the circumstances, small cranes or other types of lifting platforms are also used. Given servicing or an upgrade, the installation and removal of larger structural components proves to be complicated, since a service technician can not handle the removal of the old structural component and the installation of the new structural component alone, due to the dimensions and the weight. An example for the upgrade of such a structural component is the installation of a new radio-frequency body coil in a magnetic resonance spectroscopy device, in particular the installation of the radio-frequency body coil in the gradient coils. The same problem also occurs in the initial installation of magnetic resonance spectroscopy devices.

SUMMARY OF THE INVENTION

An object of the present invention is to simplify the installation and removal of larger components of medical large devices.

This object is inventively achieved by a device to Install and remove a structural component in and from a medical large device with the aid of a two-part guide system. The first part can be attached to a height-adjustable patient bed of the large device. The other part can be attached to the structural component. One of the two parts has a first guide rail or track and the other has a guide channel. Given placement of the structural component on the patient bed, the guide rail and the guide channel cooperate such that the structural component can be moved only along the guide rail. An attachment of the guide rail, for example to the patient bed, enables the structural component (that is provided with the guide channel) to move along the guide rail almost without effort. The placement of the structural component on the patient bed can ensue with the patient bed in a lowered state. The raising of the structural component is subsequently possible with the aid of the patient bed, such that, for the most part, a service technician can effect the installation and removal. The guide rail can be separable for purposes of transport. The guide channel also can be separated at the structural component into a number of subsections, without limiting its function.

The above object also is achieved in accordance with the invention by a method to install and remove a structural component in a medical large device. For this, a first part of a guide system is positioned on a height-adjustable patient positioning device of the medical large device. In the installation event, the structural component with a second part of the guide system is subsequently placed on the first part of the guide system. Both parts of the guide system effect a guided displaceability of the structural component. The structural component is subsequently raised with the aid of the patient positioning device until the structural component is located at the installation height. The structural component is subsequently slid (pushed) along the guide rail into the medical large device. Given the removal event of the structural component, after the positioning of the first part of the guide system at the height-adjustable patient positioning device, this is raised to the removal height. The structural component with the second part of the guide system is slid out of the medical large device and lowered with the aid of the patient positioning device. The structural component is subsequently removed from the first part of the guide system. This method has the advantage that is significantly simplifies the installation and removal, and for the most part can be implemented by only a single service technician. Under the circumstances, only given the placement of the structural component on or, respectively, the removal of the structural component from the lowered patient positioning device does the service technician still require help. He can implement the raising, lowering, as well as the sliding in and out, along with the aid of the invention.

Furthermore, the above object is achieved in accordance with the invention by a magnetic resonance tomography device that comprises a device to install and remove a structural component in the manner specified above, and by a magnetic resonance tomography device with gradient system and a radio-frequency body antenna that is fashioned to implement a method in the above-specified manner.

In an embodiment of the device for installation and removal, the first guide rail can be attached to the patient bed by means of at least one attachment element. For this, for example, two attachment elements each have two notches (recesses) in which, respectively, the ends of the guide rails are positioned, such that the guide rails and attachment elements form a type of bridge structure in which the attachment elements form the bridge piers that are connected by the guide rails. This has the advantage that one or more guide rails can be arranged in a simple manner in a sustainable stable configuration.

In another embodiment of the device for installation and removal, a second guide rail is attached to the medical large device that, given a corresponding raised position of the patient bed, forms an extension of the first guide rail. This has the advantage that the guide system extends over the patient bed and over the medical large device, or at least part of the medical large device.

In another embodiment, the second guide rail, as well as the guide channel arranged on the structural component, are made of plastic (synthetic). This has the advantage that the integral parts of the guide system do not influence magnetic fields.

In an embodiment of the method for installation and removal of a structural component into and from a medical large device, the first part of the guide system is a guide rail that is positioned on the patient bed with the aid of attachment arrangement. The attachment arrangement has a component with a notch into which the guide rail is placed. Two such components are then located at the beginning or, respectively, at the end of two parallel guide rails. The second part of the guide system is a guide notch that is located on the structural component.

DESCRIPTION OF THE PREFERRED EMBODIMENTS

Figure 1:
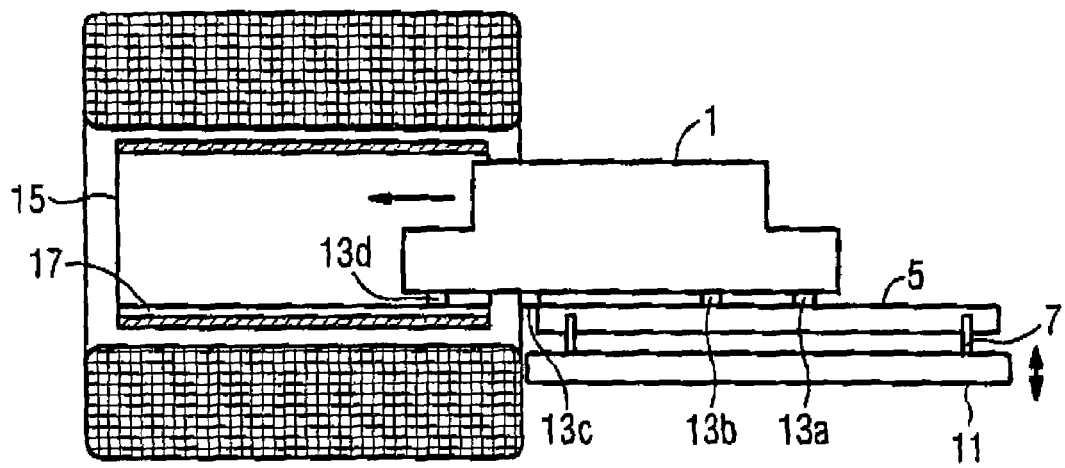
FIG. 1 is a schematic illustration of an exemplary assembly of an installation and removal device according to the invention.

FIG. 1 shows the mode of operation of the installation and removal device, as well as the process of the method in the example of the installation of a radio-frequency body coil. 1 in a magnetic resonance tomography device 3. Two rails 5 are connected with one another with two attachment elements 7 and form a rail system. The rail system is placed on the patient bed 11 and, together with the patient bed 11, is lowered to a lower setting. The radio-frequency body coil 1 is subsequently placed on the rail system, whereby bearing supports 13a, 13b, 13c, 13d attached to the radio-frequency body coil with fins come to lie on the rails 5. The bearing supports 13a, 13b, 13c, 13d are aligned in pairs in respective rows, meaning each pair is attached to the cylindrical radio-frequency coil 1 at an identical angle, such that their guide fins reproduce two straight guide channels in sections. Only one bearing support 13a, . . . 13d is shown for each pair. The guide fins operate as a guide channel and prevent a rotational movement around the cylinder axis. Both rails 5 of the rail system are adapted to one another with regard to their relative positions and to the angular positions of the guide fins of the supports 13a, 13b, 13c, 13d with regard to their radial alignment.

In the likewise cylindrical gradient coil 15 that forms the gradient system of the magnetic resonance tomography device 3, two further plastic rails 17 are glued in place at the same angle and thus form an extension of the rails 5 within the gradient coil 15. The patient bed 11 is now raised far enough that the rails 5 are at a height with the plastic rails 17 of the gradient coil 15. In this position, the radio-frequency body coil 1 can easily be slid into the gradient coil 15 of the magnetic resonance spectroscopy device 3.

Figure 2:
FIG. 2 is a side view of an exemplary guide rail.

FIG. 2 shows a side view of a guide rail 5. At both ends, the guide rail 5 comprises notches that, in the assembly of the rail system, fit into notches of the attachment elements 7.

Figure 3:
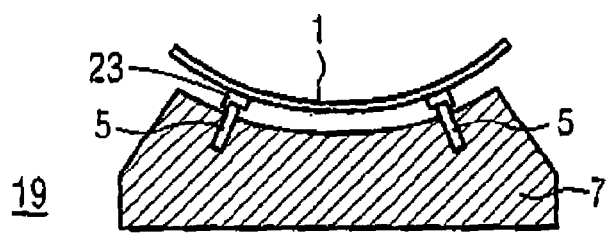
FIG. 3 shows the basic features of an exemplary installation and removal device according to the invention.

FIG. 3 shows the substantial features of a device 19 for Installation and removal of a structural component 21. The attachment element 7 is adapted to the shape of the structural component 21, in this case a cylindrical shape. The rails 5 (which, as noted, have matching notches at the ends) are inserted into two notches of the attachment element 7. Bearing supports 23 (each with one guide groove) are attached to the structural component 21, such that upon placement of the structural component 21 the bearing supports with the guide grooves come to lie on the guide rails 21. The guide groove on the bearing support 23 is realized by a one-sided guide fin.

Figure 4:
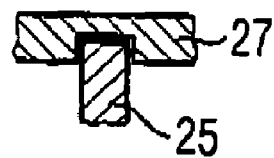
FIG. 4 illustrates an embodiment of a guide notch.

FIG. 4 shows a further possibility for the guide groove in which the rail 25 is positioned in a notch of the guide groove of the bearing support 27. Given the use of such a guide system, only a guiding positioning is necessary, such that the second guide rail serves only for positioning purposes, meaning the appertaining positioning support does not compulsorily require a guide groove.

Figure 5:
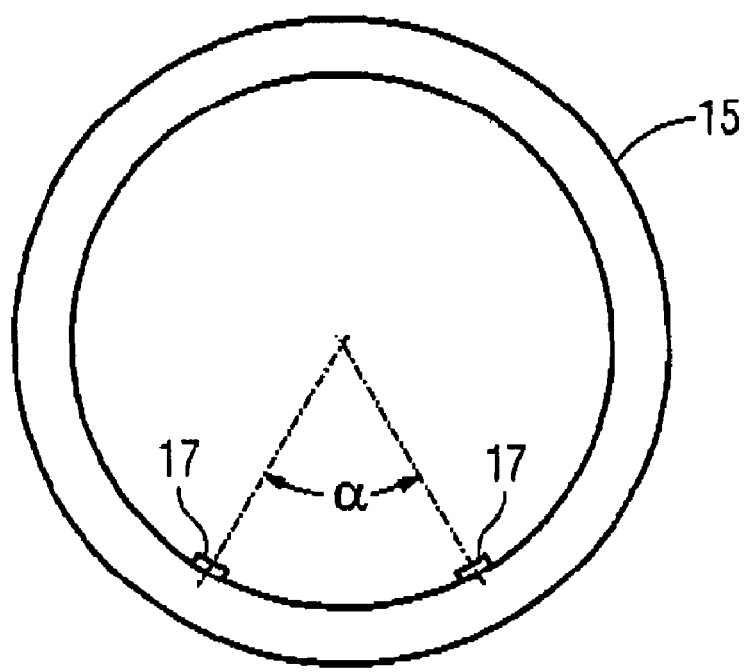
FIG. 5 is a cross-section through a gradient coil with a second pair of guide rails.

A cross section through the gradient coil 15 from FIG. 1 is shown in FIG. 5. In the gradient coil 15, the two plastic rails 17 are attached at the same angle α at which the guide rails 5 are arranged on the attachment element 7 from FIG. 2. The plastic rails 17 can be glued in place, and in addition to the guiding function have the task of protecting the gradient coil 15 from the component to be installed. A further advantage of the guided insertion of the component with the aid of the guiding bearing supports is that the component to be installed is automatically correctly positioned, and can not shift laterally in the gradient coil 15.

The guide rails 5 can also be formed by a number of shorter pieces, such that the complete system can be conveniently transported in a transport container, for example a carrying case. Such a system can simply be taken along to the system to be serviced, without that a complicated lifting platform would be required. This is in particular very helpful in service uses or in upgrade installations, since with such a compact realization of the installation and removal device, the space requirement in transport is reduced and the radio-frequency body coil exchange can be implemented by only one person.

The exemplary embodiment can, for example, be summarized again in the following manner: a device to install/remove a structural component in and from a medical large device has a guide system that simplifies the difficult handling of the structural component in the installation/removal due to the size or the weight of the structural component. The guide system includes a first guide rail that can be positioned, for example, on a height-adjustable patient bed of the large device and a guide groove which is arranged on the structural component, for example by means of structural supports. Additionally, another second guide rail can be attached to the medical large device which forms an extension of the first guide rail in the event that the patient bed would be correspondingly positioned. With the aid of the device according to the invention, the structural component can be easily raised and lowered with the aid of the height-adjustable patient bed and can easily be slid into or out of the large device when the first and second rails are at the same height.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for installing and removing a structural component of a medical device comprising the steps of:
   positioning a first part of a guide system at a height-adjustable patient patient supporting apparatus of the medical device;
   forming a second part of the guide system on a structural component, separate from said patient supporting apparatus and temporarily detachably engaging said first part of said guide system with said second part of said guide system with said structural component on said guide system on said patient supporting apparatus; and
   adjusting the height of the patient supporting apparatus to selectively raise and lower the structural component therein relative to said medical device, and sliding said structural component along said first and second parts of said guide system to install or remove said component relative to said medical device.

* * * * *